United States Patent [19]
Ito et al.

[11] Patent Number: 5,548,162
[45] Date of Patent: Aug. 20, 1996

[54] ELECTRONIC CIRCUIT HAVING COMPARATOR

[75] Inventors: Hidenobu Ito, Aichi; Katsuya Shimizu, Kasugai; Kenzo Hashikawa; Yasuhiro Yamakawa, both of Kobe, all of Japan

[73] Assignees: Fujitsu Limited, Kawasaki; Fujitsu VLSI Limited, Kasugai; Fujitsu Ten Limited, Kobe, all of Japan

[21] Appl. No.: 392,300

[22] Filed: Feb. 22, 1995

Related U.S. Application Data

[63] Continuation of Ser. No. 72,874, Jun. 4, 1993, abandoned, which is a continuation of Ser. No. 844,923, Mar. 3, 1992, abandoned, which is a continuation of Ser. No. 397,834, Aug. 24, 1989, abandoned.

[30] Foreign Application Priority Data

Aug. 26, 1988 [JP] Japan ................... 63-213367

[51] Int. Cl.$^6$ ................... G01R 19/00
[52] U.S. Cl. ................... 307/10.1; 327/53
[58] Field of Search ................... 307/10.1, 10.7, 307/130, 43, 45; 327/50–53, 66, 89, 538, 584, 310, 314, 77, 362; 361/18, 187, 206, 90–92; 340/660, 661, 636; 323/315, 281, 282, 351; 322/8; 123/618

[56] References Cited

U.S. PATENT DOCUMENTS

| | | | |
|---|---|---|---|
| 4,008,418 | 2/1977 | Murphy | 361/18 |
| 4,399,399 | 8/1983 | Joseph | 323/315 |
| 4,680,530 | 7/1987 | Mashino | 322/28 |
| 5,014,675 | 5/1991 | Koiwa | 123/618 |
| 5,047,707 | 9/1991 | Dixon et al. | 307/296.6 |
| 5,109,827 | 5/1992 | Nobe et al. | 123/618 |

OTHER PUBLICATIONS

IBM Technical Disclosure Bulletin, vol. 20, No. 8 (Jan. 1978), pp. 3056–3057, *Constant Voltage Reference Source*, Carroll et al.

IBM Technical Disclosure Bulletin, vol. 21, No. 7 (Dec. 1978), pp. 2719–2720, *Gated Current Source*, Spencer, Jr.

*Primary Examiner*—William M. Shoop, Jr.
*Assistant Examiner*—Richard T. Elms
*Attorney, Agent, or Firm*—Staas & Halsey

[57] ABSTRACT

An electronic circuit comprising a comparator which is operated by a first power source voltage and having first and second input terminals, where the first input terminal is supplied with a reference voltage which is dependent on the first power source voltage, a detecting circuit for detecting a deviation of a second power source voltage and for outputting a control signal dependent on the deviation, where the first and second power source voltages undergo mutually independent deviations, and a voltage converting circuit supplied with an input signal for converting a voltage of the input signal depending on the control signal received from the detecting circuit. The voltage converting circuit supplies the input signal to the second input terminal of the comparator which outputs an error signal indicative of an error between the input signal voltage and the reference voltage.

16 Claims, 6 Drawing Sheets

5,548,162

1

ELECTRONIC CIRCUIT HAVING COMPARATOR

This application is a continuation of application Ser. No. 08/072,874, filed Jun. 4, 1993 now abandoned, which is a continuation of application Ser. No. 07/844,923, filed Mar. 3, 1994, now abandoned, which is a continuation of application Ser. No. 07/397,834, filed Aug. 24, 1989, now abandoned.

BACKGROUND OF THE INVENTION

The present invention generally relates to electronic circuits, and more particularly to an electronic circuit which is especially suited for use with an input buffer circuit of an electronic device which carries out a digital signal processing in an automobile for example.

Recently, electronic devices control various parts of an automobile. For example, signals from various sensors are supplied to an electronic device of the automobile such as a control unit wherein a digital signal processing is carried out. In this case, there is a demand for the control unit to accurately read the signals from the various sensors and operating states of other processing circuits.

FIG. 1 shows an example of a conventional electronic circuit which is used in an automobile. A processing circuit 17 enters an output signal of a sensor 16. For example, the processing circuit 17 is an air conditioning system which drives a coil L1. An output signal of the processing circuit 17 is applied to a terminal 10 and is supplied to the coil L1 via transistors Q1 and Q2 which form a Darlington pair and a protection resistor R1. A control unit 11 controls a fuel injection quantity and the like of an engine (not shown). The control unit 11 has a terminal 12 which receives a voltage indicative of a driving state of the coil L1. The voltage received from the terminal 12 is supplied to a non-inverting input terminal of a comparator 13, and the control unit 11 carries out a control such as increasing an idling speed of the engine depending on an output signal of the comparator 13. The terminal 12 is supplied with a power source voltage +B from a battery 14 via the coil L1. For example, the power source voltage +B is +12 V.

The control unit 11 has the form of a semiconductor integrated circuit package, and is supplied with a power source voltage Vcc from the battery 14 via a regulator 18. For example, the power source voltage Vcc is +5 V. A reference voltage Vref which is obtained by dividing the power source voltage Vcc by a voltage divider made up of resistors R2 and R3 is supplied to an inverting input terminal of the comparator 13. The power source voltage +B from the battery 14 is also supplied to loads such as a light 15.

The reference voltage Vref is obtained by dividing the power source voltage Vcc. For this reason, when the power source voltage Vcc deviates, the reference voltage Vref undergoes a corresponding deviation and the deviation of the power source voltage Vcc is compensated thereby.

On the other hand, the signal voltage which is supplied to the terminal 12 is dependent on the power source voltage +B but a deviation of the power source voltage +B is unrelated to a deviation of the power source voltage Vcc as long as the deviation of the power source voltage +B is within a deviation range which can be compensated by the regulator 18. As a result, even when no signal change occurs at the terminal 10, there is a problem in that the control unit 11 may carry out an erroneous operation due to the deviation of the power source voltage +B.

2

In addition, the ground of the electronic circuit shown in FIG. 1 is a metal body (not shown) of the automobile and includes some resistance component. For this reason, when a switch SW closes and a large current flows through the load such as the light 15, an emitter potential of the transistor Q2 may rise. This potential rise corresponds to the deviation of the power source voltage +B and causes a problem similar to the above by changing the signal voltage at the terminal 12.

SUMMARY OF THE INVENTION

Accordingly, it is a general object of the present invention to provide a novel and useful electronic circuit in which the problems described above are eliminated.

Another and more specific object of the present invention is to provide an electronic circuit comprising a comparator which is operated by a first power source voltage and having first and second input terminals, where the first input terminal is supplied with a reference voltage which is dependent on the first power source voltage, a detecting circuit for detecting a deviation of a second power source voltage and for outputting a control signal dependent on the deviation, where the first and second power source voltages undergo mutually independent deviations, and a voltage converting circuit supplied with an input signal for converting a voltage of the input signal depending on the control signal received from the detecting circuit. The voltage converting circuit supplies the input signal to the second input terminal of the comparator which outputs an error signal indicative of an error between the input signal voltage and the reference voltage. According to the electronic circuit of the present invention, it is possible to prevent the output error signal of the comparator from undergoing a deviation even when the first and second power source voltages change. Thus, the electronic circuit is especially suited for use in an automobile in which a battery is used to supply the second power source voltage.

Other objects and further features of the present invention will be apparent from the following detailed description when read in conjunction with the accompanying drawings.

DESCRIPTION OF THE PREFERRED EMBODIMENTS

Figure 1:
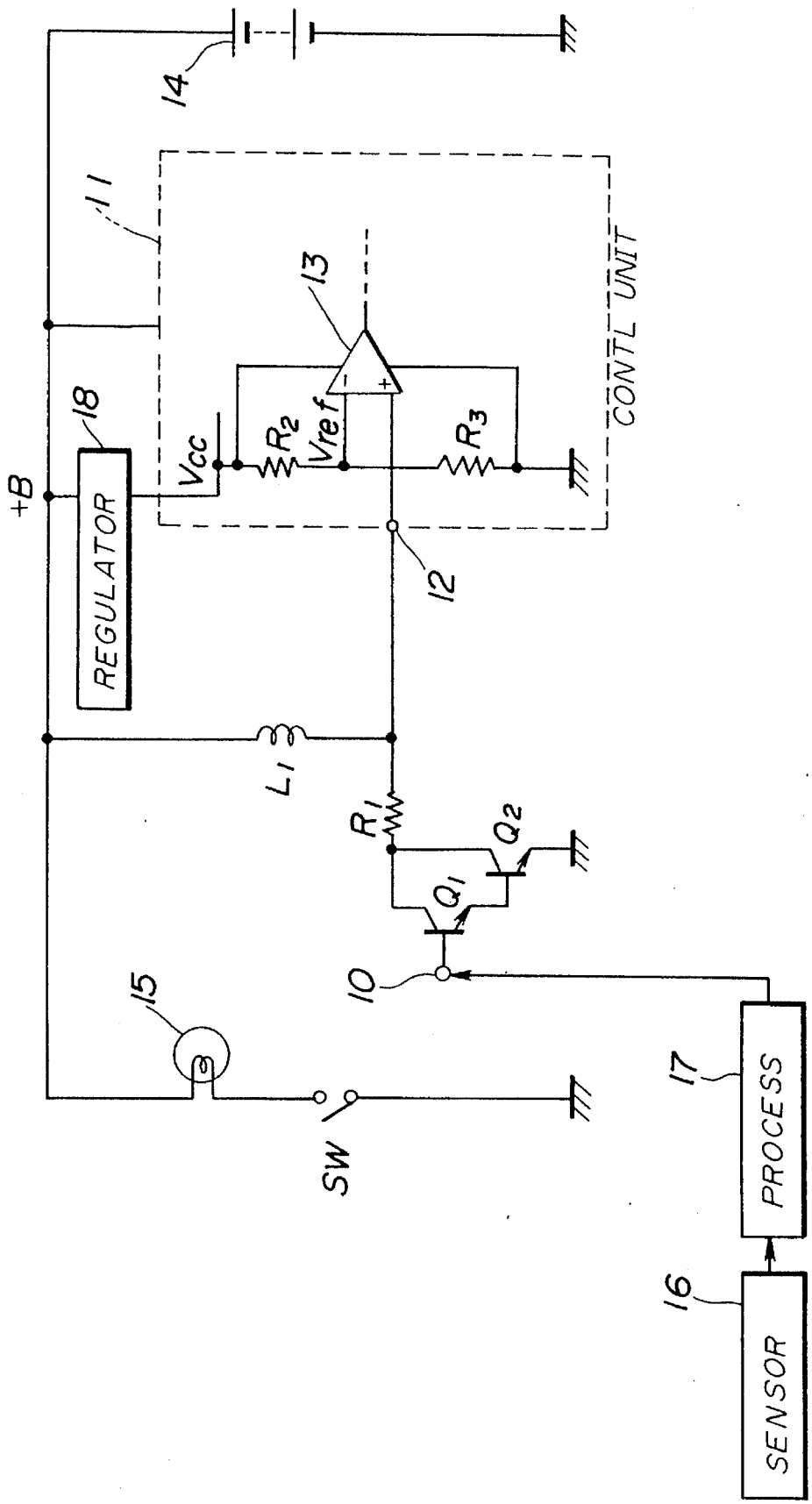
FIG. 1 is a circuit diagram showing an example of a conventional electronic circuit which is used in an automobile.
Figure 2:
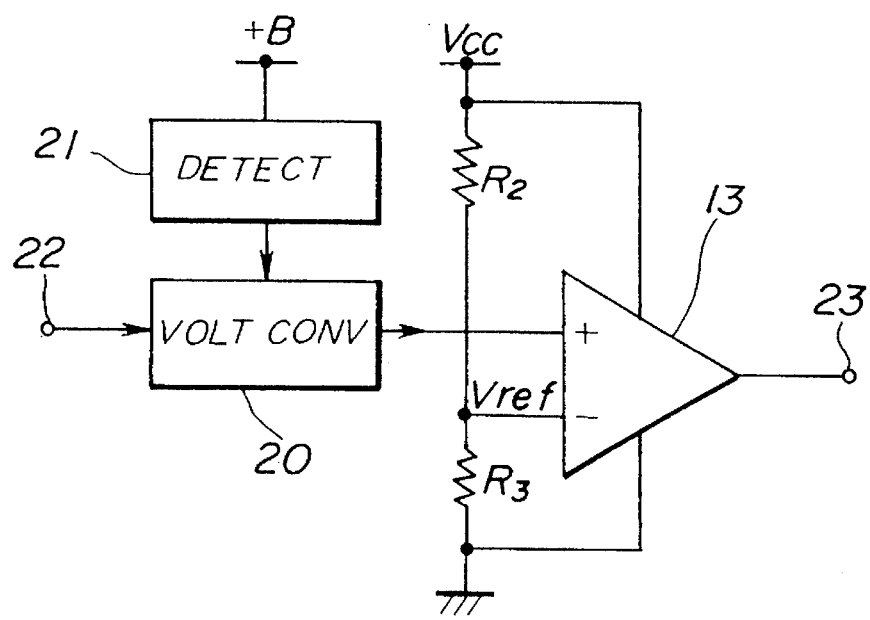
FIG. 2 is a system block diagram generally showing an electronic circuit according to the present invention for explaining an operating principle thereof.

FIG. 2 generally shows an electronic circuit according to the present invention for explaining an operating principle thereof. In FIG. 2, those parts which are essentially the same as those corresponding parts in FIG. 1 are designated by the same reference numerals. In FIG. 2, the comparator 13 is supplied with the power source voltage Vcc and is operated thereby. An input signal having a voltage which is different from the power source voltage Vcc but is dependent on the power source voltage +B is applied to a terminal 22. The reference voltage Vref which is obtained by dividing the power source voltage Vcc by a voltage divider made up of the resistors R2 and R3 is supplied to the inverting input terminal of the comparator 13.

On the other hand, a detecting circuit 21 detects a deviation of the power source voltage +B and supplies to a voltage converting element 20 a current which is dependent on the deviation of the power source voltage +B. The voltage converting element 20 reduces the voltage of the input signal depending on the current received from the detecting circuit 21, and an output voltage of the voltage converting element 20 is supplied to the non-inverting input terminal of the comparator 13. The comparator 13 compares the voltages supplied to the inverting and non-inverting input terminals thereof and outputs a digital signal via a terminal 23.

The power source voltage Vcc is used as the operating power source of the comparator 13 and is also used to generate the reference voltage Vref. For this reason, a deviation of the power source voltage Vcc is satisfactorily compensated. On the other hand, the input signal which is dependent on the power source voltage +B is reduced by the detecting circuit 21 and the voltage converting element 20 depending on a deviation of the power source voltage +B. Hence, the deviation of the power source voltage +B is also satisfactorily compensated.

Accordingly, the output signal of the comparator 13 is prevented from changing due to the deviations of the power source voltages Vcc and +B, and it is possible to effectively prevent an erroneous operation of the electronic circuit when it is used in an automobile.

Figure 3:
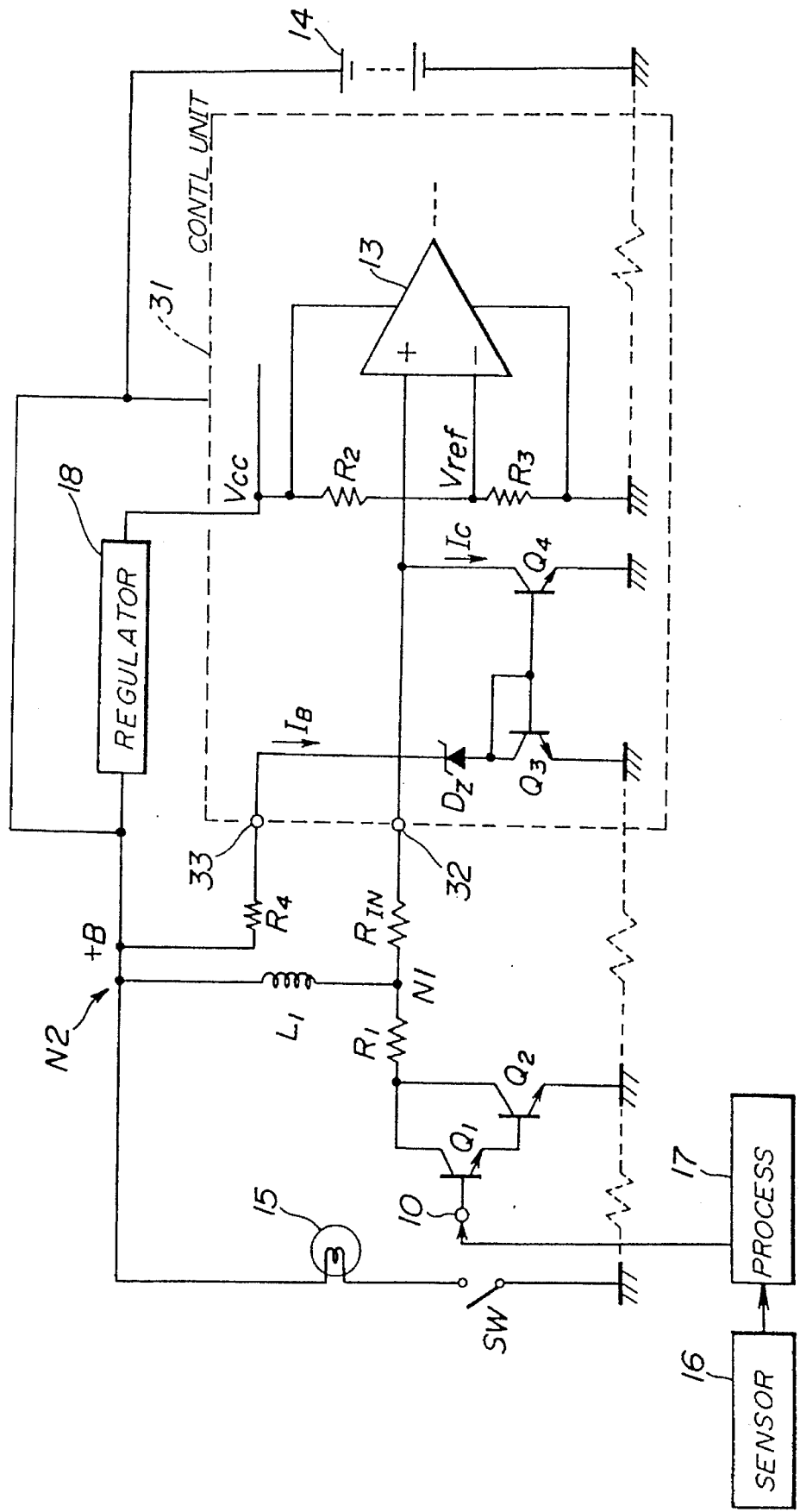
FIG. 3 is a circuit diagram showing an embodiment of the electronic circuit according to the present invention.

Next, a description will be given of an embodiment of the electronic circuit according to the present invention, by referring to FIG. 3. In FIG. 3, those parts which are essentially the same as those corresponding parts in FIG. 1 are designated by the same reference numerals, and a description thereof will be omitted.

In FIG. 3, a resistor $R_{IN}$ is connected between a node N1 which connects the resistor R1 and the coil L1 and a terminal 32 of a control unit 31. The resistor $R_{IN}$ corresponds to the voltage converting element 20 shown in FIG. 2. A terminal 33 of the control unit 31 receives the power source voltage +B via a resistor R4.

The reference voltage Vref which is obtained by dividing the power source voltage Vcc by the voltage divider made up of the resistors R2 and R3 is supplied to the inverting input terminal of the comparator 13. The output signal of the comparator 13 is supplied to a circuit (not shown) which is in a next stage of the control unit 31. The power source voltage Vcc is obtained from the regulator 18 which stabilizes the power source voltage +B.

A cathode of a Zener diode $D_Z$ is connected to the terminal 33. An anode of the Zener diode $D_Z$ is connected to a base and a collector of a transistor Q3 and a base of a transistor Q4. The transistors Q3 and Q4 have identical emitter areas and emitters of these transistors Q3 and Q4 are grounded to constitute a current mirror circuit. A collector of the transistor Q4 is connected to the terminal 32. A circuit constituted by the resistor R4, the Zener diode $D_Z$ and the transistors Q3 and Q4 corresponds to the detecting circuit 21 shown in FIG. 2.

For the sake of convenience, a voltage drop across the Zener diode $D_Z$ is denoted by $V_P$, a base-emitter voltage of the transistor Q3 in the ON state is denoted by $V_{BE}$, and a stabilized voltage of the power source voltage Vcc is denoted by $V_D$. In this case, $V_P+V_{BE}$ is selected to a value which is slightly larger than $V_D$.

In a state where $+B<V_P+V_{BE}$, no current flows to the resistor $R_4$ from a node N2 which has the potential +B and the transistors Q3 and Q4 are OFF. For this reason, no current flows to the resistor $R_{IN}$ and a threshold value $V_{TH1}$ of the comparator 13 can be described by the following formula (1).

$$V_{TH1}=Vcc\times R3/(R2+R3) \quad (1)$$

In a region where $+B<V_P+V_{BE}$, the regulator 18 cannot maintain the power source voltage Vcc stable and the power source voltage Vcc decreases with a decrease in the power source voltage +B. Hence, an indirect compensation is made with respect to a deviation of the power source voltage +B.

Next, in a normal operating state where $+B\geq V_P+V_{BE}$, a current $I_B$ described by the following formula (2) flows through the resistor R4.

$$I_B=(+B-V_P-V_{BE})/R4 \quad (2)$$

In other words, the current $I_B$ changes proportionally to a change in the power source voltage +B. At the same time, a current $I_C$ which is equal to the current $I_B$ flows to the resistor $R_{IN}$ by the operation of the current mirror circuit which is constituted by the transistors Q3 an Q4, and a potential at the terminal 32 drops by $R_{IN}\times I_C$. This potential drop at the terminal 32 occurs depending on the deviation of the power source voltage +B. That is, the voltage drop across the resistor $R_{IN}$ increases when the power source voltage +B rises and decreases when the power source voltage +B falls. Accordingly, a threshold voltage $V_{TH2}$ of the comparator 13 can be described by the following formula (3) and the deviation of the power source voltage +B is compensated.

$$V_{TH2}=V_{TH1}+R_{IN}\times I_C \quad (3)$$

Figure 4:
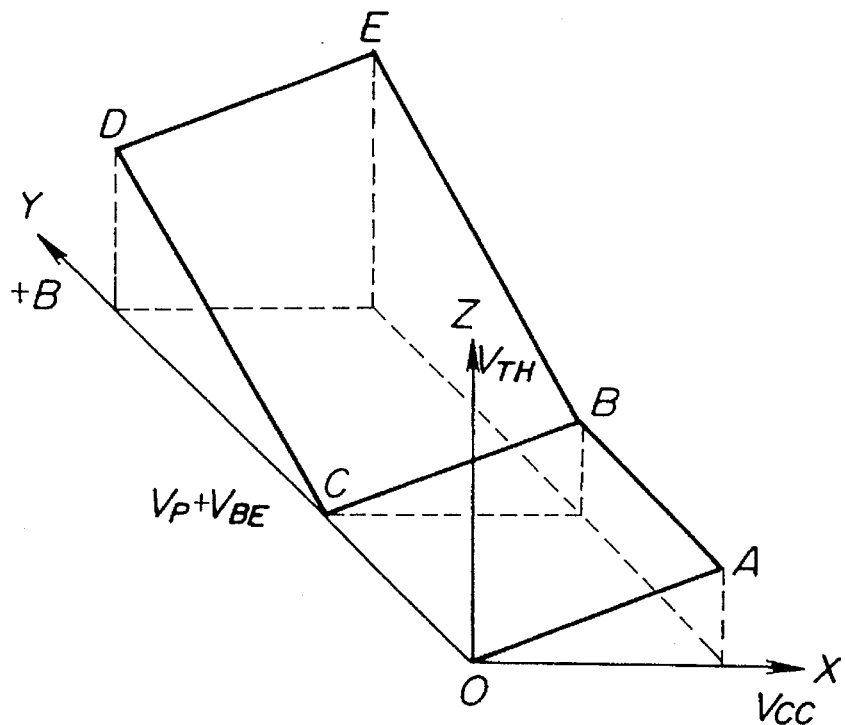
FIG. 4 is a diagram for explaining a characteristic of the embodiment shown in FIG. 3.

FIG. 4 shows a characteristic of the embodiment shown in FIG. 3. In FIG. 4, the X-axis indicates the power source voltage Vcc, the Y-axis indicates the power source voltage +B, and the Z-axis indicates a threshold voltage $V_{TH}$ of the comparator 13. In a state where $+B<V_P+V_{BE}$, the threshold voltage $V_{TH1}$ is located on a plane OABC and is dependent on the power source voltage Vcc. On the other hand, in a state where $+B\geq V_P+V_{BE}$, the threshold voltage $V_{TH2}$ is located on a plane BCDE and is dependent on the power source voltages Vcc and +B. However, since Vcc is substantially constant in the range where $+B\geq V_P+V_{BE}$, the threshold voltage $V_{TH2}$ in this state is substantially located on a line BE.

In the described embodiment, the Zener diode $D_Z$ is used as a D.C. voltage source. However, it is of course possible to use other diodes which are connected in series and the like. In addition, the voltage shift quantity $V_P$ of the D.C. voltage source is not limited to a positive value and may be selected to zero or a negative value. For example, in a case where the voltage shift quantity $V_P$ is set to zero, no D.C. voltage source is required.

For example, a chip MB4001 manufactured by Fujitsu Ltd. of Japan may be used for the comparator 13. Further, a chip MB3752 manufactured by Fujitsu Ltd. of Japan may be used for the regulator 18.

Figure 5A:
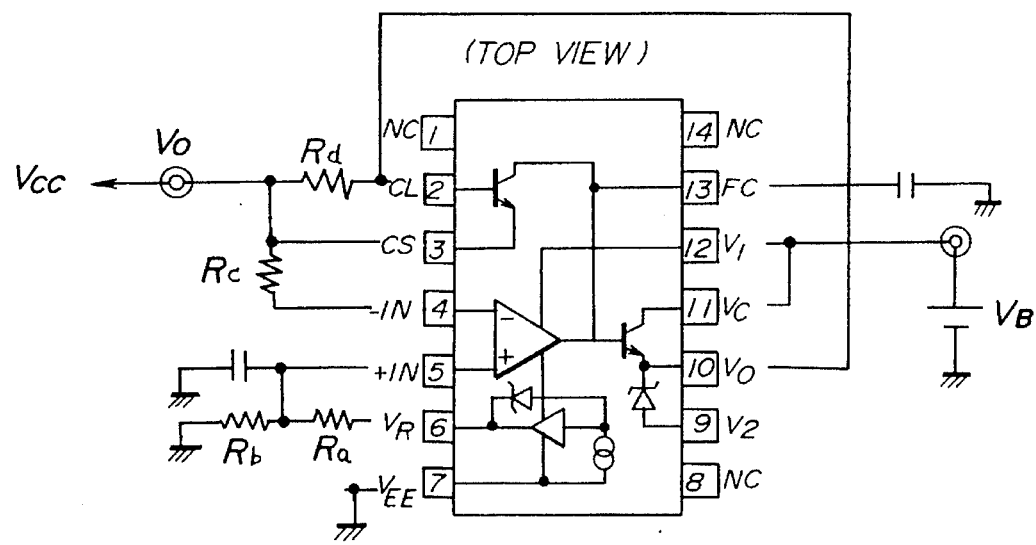
FIGS. 5A and 5B are a top view and a circuit diagram respectively showing a regulator.
Figure 5B:
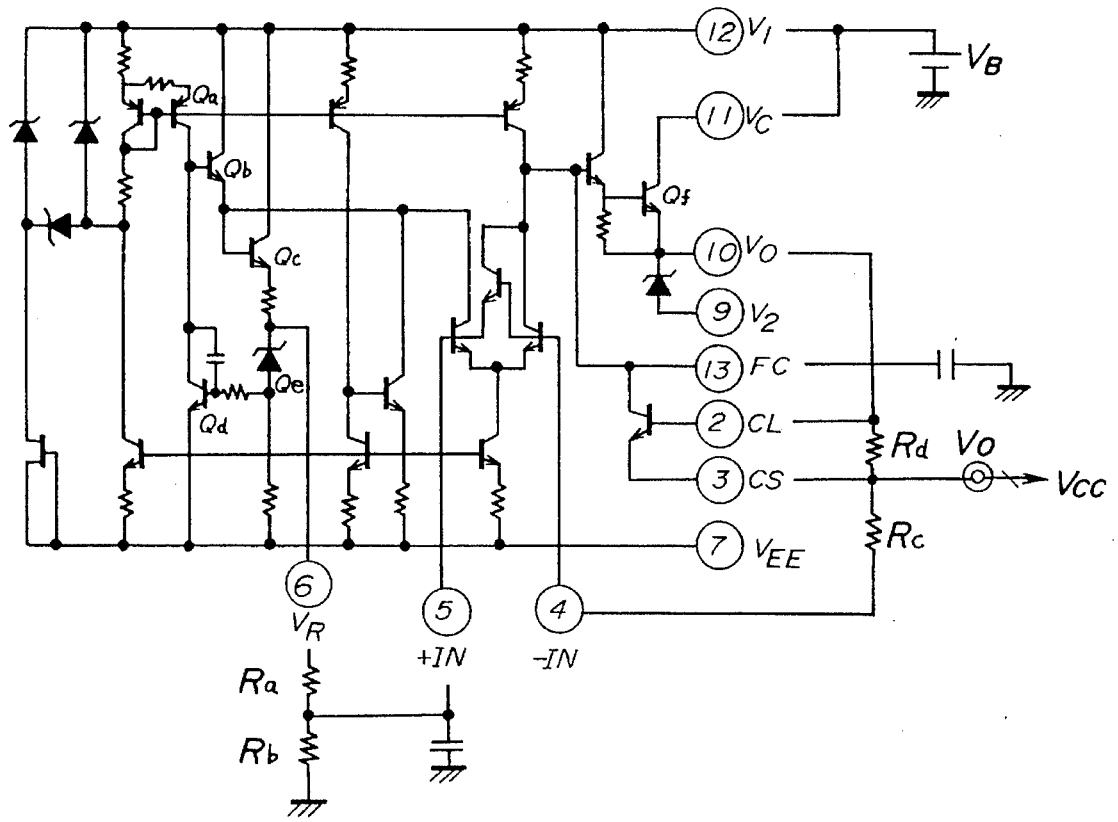

FIG. 5A is a top view of the chip MB3752, and FIG. 5B shows a circuit construction of the chip MB3752, both with external elements connected thereto. The chip MB3752 is capable of dividing an internally generated reference voltage by use of externally connected resistors or the like and supplying the divided voltage to an internal operational amplifier. A required voltage is obtained by feeding back an output of the internal operational amplifier via an external resistor or the like and amplifying the output.

A reference voltage $V_R$ due to a voltage drop $V_Z$ of a Zener diode (transistor $Q_e$) and a base-emitter voltage $V_{BE}$ of a transistor $Q_d$ is generated at a terminal "6". This reference voltage $V_R$ is divided by external resistors Ra and Rb to obtain a voltage $V_{R'}$. This voltage $V_{R'}$ is applied to a terminal "5" and supplied to a non-inverting input terminal of the internal operational amplifier. An output of the internal operational amplifier is supplied to an output transistor $Q_f$. An output of the output transistor $Q_f$ obtained from a terminal "10" is applied to a terminal "4" and supplied to an inverting input terminal of the internal operational amplifier to stabilize the output voltage. An external resistor Rc is used to correct an offset caused by an input bias current of the internal operational amplifier. An external resistor Rd is used to protect the output transistor $Q_f$.

In FIGS. 5A and 5B, the feedback signal is all applied to the internal operational amplifier and the gain is 0 dB. An output voltage $V_O$ of the regulator 18 is $V_O=V_R \times [Rb/(Ra+Rb)]$.

Figure 6:
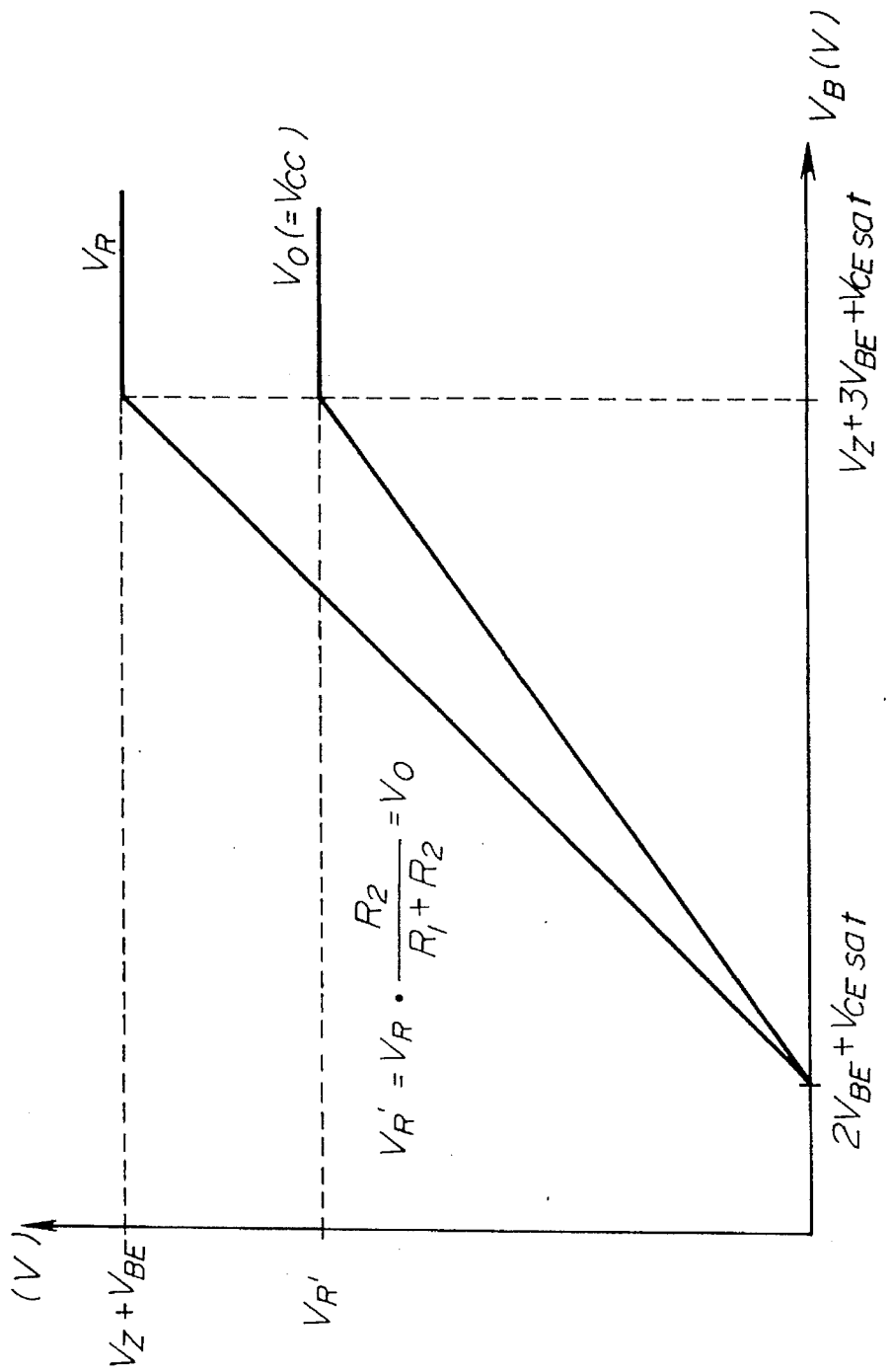
FIG. 6 shows a characteristic of the regulator shown in FIGS. 5A and 5B.

FIG. 6 shows a relationship of the power source voltage +B and the output voltage $V_O$ of the regulator 18. The output voltage $V_O$ is determined by the Zener voltage $V_Z$ of the Zener diode (transistor $Q_e$) and the base-emitter voltage $V_{BE}$ of the transistor $Q_d$. However, when the power source voltage +B decreases, the reference voltage $V_R$ is clamped at a voltage which is lower than +B by a saturation voltage $V_{CEsat}$ of a transistor $Q_a$ and a sum of base-emitter voltages $V_{BE}$ of transistors $Q_b$ and $Q_C$. In other words, the reference voltage $V_R$ decreases proportionally to the power source voltage +B when $+B \leq V_x$, where $V_x=V_{BE}(Q_d)+V_z(Q_e)+V_{BE}(Q_c)+V_{BE}(Q_b)+V_{CEsat}(Q_a)$. Accordingly, the output voltage $V_O$ which is obtained by dividing the reference voltage $V_R$ also decreases proportionally to +B when $+B \leq V_x$.

Figure 7:
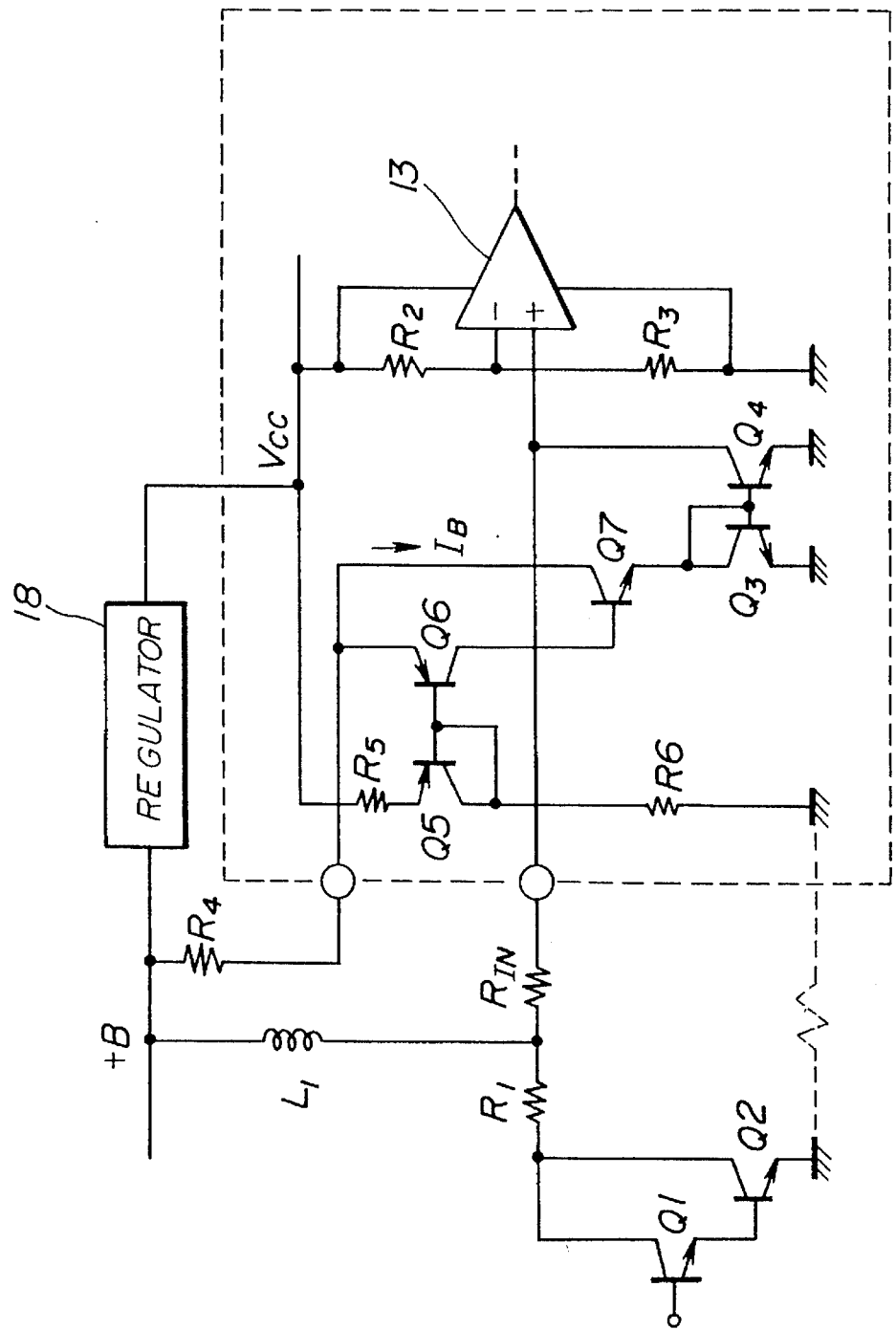
FIG. 7 is a circuit diagram showing an essential part of a second embodiment of the electronic circuit according to the present invention.

Next, a description will be given of another embodiment of the electronic circuit according to the present invention, by referring to FIG. 7. In FIG. 7, those parts which are the same as those corresponding parts in FIG. 3 are designated by the same reference numerals, and a description thereof will be omitted.

In FIG. 7, a circuit part constituted by transistors Q5 through Q7 and resistors R5 and R6 is used in place of the Zener diode $D_Z$ of the embodiment described before. The base voltage $V_{Q5B}$ of the transistor Q5 can be described by $V_{Q5B}=(V_{CC}-V_{BE}) \times R6/(R5+R6)$, where $V_{BE}$ is the base emitter voltage of the transistor Q5. In this embodiment, it is possible to vary a voltage at which the threshold voltage starts to become dependent on the power source voltage +B by varying a ratio of the resistances of the resistors R5 and R6. This is because the current $I_B$ can be described by the following formula (4), where it is assumed that the base-emitter voltages $V_{BE}$ of the transistors Q3 through Q7 are the same. That is, since a voltage $(+B-V_{Q6E})$ is applied across the terminals of the resistor R4, the current $I_B$ is as follows: $I_B=(+B-V_{Q6E})R4$ $$I_B=+B[(Vcc-V_{BE}) \times R6/(R5+R6)+V_{BE}]/R4 \qquad (4)$$

Thus, the transistor Q6 is provided to obtain an emitter potential which is approximately the same as the emitter potential of the transistor Q5. Because, however, the collector of the transistor Q6 is connected to the base of the transistor Q7, the current flowing between the emitter and collector of the transistor Q6 is not the same as the current flowing between the emitter and collector of the transistor Q5. That is, the base-emitter voltage $V_{BE}$ of the transistor Q5 and the base-emitter voltage $V_{BE}$ of the transistor Q6 are not exactly equal, but the difference between the two base-emitter voltages $V_{BE}$ is negligible from a practical standpoint. Therefore, the base-emitter voltage $V_{BE}$ of the transistor Q5 is assumed to be the same as the base-emitter voltage $V_{BE}$ of the transistor Q6.

Further, the present invention is not limited to these embodiments, but various variations and modifications may be made without departing from the scope of the present invention.

What is claimed is:

1. An electronic circuit comprising:

a comparator operated by a first power source voltage and having a reference terminal and a sense terminal, said reference terminal being supplied with a reference voltage which is formed by a voltage driver in response to said first power source voltage;

a detecting circuit operatively connected to the sense terminal of said comparator and a second power source voltage to detect a deviation of said second power source voltage and to output a compensation signal dependent on the deviation;

a device control circuit having an output terminal to output a signal from said output terminal to said sense terminal of said comparator;

a device having a first device terminal operatively connected to said second power source voltage and having a second device terminal coupled to the output terminal of said device control circuit to provide a voltage dependent upon the output from said device control circuit via said second device terminal; and a voltage converting circuit operatively connected between the second device terminal of said device and said detecting circuit to receive an input signal from said second device terminal and convert a voltage on the sense terminal of said comparator dependent on a compensation signal from said detecting circuit for compensation for the rise of said second power source, said voltage converting circuit supplying a comparator input signal to the sense terminal of said comparator which outputs a control signal based on comparison between a voltage of the comparator input signal and the reference voltage.

2. An electronic circuit as claimed in claim 1, further comprising a battery to provide said second power source voltage.

3. An electronic circuit as claimed in claim 2, further comprising a voltage regulator operatively connected to said battery to receive said second power source voltage and provide said first power source voltage.

4. An electronic circuit as claimed in claim 1, further comprising a voltage divider operatively connected to said first power source voltage to obtain said reference voltage.

5. An electronic circuit as claimed in claim 1, further comprising a predetermined circuit, wherein said electronic circuit further comprises a sensor for detecting a state of an automobile and a power source for supplying the second power source voltage, wherein said predetermined circuit comprises a processing circuit operatively connected at a control terminal to control said device in response to an output signal from said sensor, and wherein said device includes a load coupled between said power source and said second device terminal.

6. An electronic circuit, comprising:

a comparator, operatively connected to a first power source voltage, having reference and sense terminals, said reference terminal being supplied with a reference voltage dependent upon said first power source voltage;

a detecting circuit, operatively connected to a second power source voltage, for detecting a deviation of said second power source voltage and outputting a compensation signal dependent upon the deviation to the sense terminal of said comparator, said detecting circuit comprising:

a first transistor having a base, having an emitter coupled to ground and having a collector;

a second transistor having a base connected to said base of said first transistor, having an emitter coupled to ground and having a collector coupled to said sense terminal;

a diode operatively connected to said collector and base of said first transistor; and a resistor operatively connected between said second power source and said diode;

a device control circuit having an output terminal to output a signal from said output terminal to said sense terminal of said comparator, a device having a first device terminal operatively connected to receive said second power source voltage and having a second device terminal operatively connected to output a voltage dependent upon the signal output from said device control circuit via said second device terminal; and voltage converting means for receiving an input signal from said second device terminal and converting a voltage of the input signal depending upon the compensation signal received from said detecting circuit, said voltage converting means supplying a comparator input signal to said sense terminal of said comparator which outputs a control signal based on comparison between a voltage of the comparator input signal and the reference voltage.

7. A system comprising a comparator circuit having a reference terminal and a sense terminal, the reference terminal operatively connected to a reference voltage derived as a function of a first power source voltage and the sense terminal operatively connected to a device connected to a second power source voltage and further comprising a compensation circuit to compensate for fluctuations of the second power source voltage with respect to the first power source voltage, said compensation circuit comprising:

a voltage drop resistor operatively connected between the device and the sense terminal of the comparator; and a detecting circuit operatively connected to the second power source voltage and the sense terminal of the comparator to detect a deviation of the second power source voltage and to alter the current through said voltage drop resistor and correct a voltage on the sense terminal of the comparator based on the deviation.

8. A system according to claim 7, wherein said detecting circuit comprises a reverse biased zener diode.

9. A system according to claim 8, wherein said reverse biased zener diode is operatively connected to the second power source voltage, through a resistor and to at least one current control transistor.

10. A system according to claim 7, wherein said detecting circuit comprises:

a current mirror circuit operatively connected to the sense terminal of said comparator; and a resistor operatively connected between the second power source voltage and said current mirror circuit.

11. A system according to claim 10, when said current mirror circuit comprises:

a first transistor having a base, having an emitter coupled to ground and having a collector;

a second transistor having a base connected to the base of said first transistor, having an emitter coupled to ground and having a collector operatively connected to the sense terminal of said comparator; and a voltage clamping device operatively connected from the collector and base of said first transistor to said resistor.

12. A system according to claim 7, further comprising a voltage regulator operatively connected to the second power source voltage to generate the first power source voltage.

13. A system according to claim 12, wherein said system further comprises an automobile battery to provide the second power source voltage; and wherein said device is a coil of an automotive air conditioner operatively connected to the second power source voltage.

14. A system having first and second power source voltages, comprising:

a device connected to the second power source voltage;

a comparator having a reference terminal and a sense terminal, the reference terminal operatively connected to a reference voltage derived as a function of the first power source voltage and the sense terminal operatively connected to said device; and compensation means for sensing a deviation of the second power source voltage and for correcting a voltage on the sense terminal of said comparator based on the deviation, said compensation means including sensing means for sensing a deviation of the second power source voltage above a predetermined voltage level and for correcting a voltage on the sense terminal of said comparator based on an amount of the deviation of the second power source voltage above the predetermined voltage level.

15. A system according to claim 14, wherein said compensation means comprises a zener diode.

16. A system according to claim 14, wherein said sensing means comprises a transistor circuit to set the predetermined voltage level and output the deviation when the second power source voltage is above the predetermined voltage.

\* \* \* \* \*

UNITED STATES PATENT AND TRADEMARK OFFICE
CERTIFICATE OF CORRECTION

PATENT NO. : 5,548,162
DATED : August 20, 1996
INVENTOR(S) : Ito et al.

It is certified that error appears in the above-indentified patent and that said Letters Patent is hereby corrected as shown below:

Cover Page [75], "Aichi" should be --Nakashima--.

Col. 4, line 23, (equation (2)) should be $$--I_B = (+B-V_p-V_{BE})/R4--.$$

Col. 5, line 52, "Q5." should be

--Q5. The transistors Q5 and Q6 form a current mirror circuit. The potential at the emitter of the transistor Q6 is approximately the same as the potential at the emitter of the transistor Q5. Therefore $V_{Q6E} = V_{Q5B} + V_{BE}$, where $V_{Q6E}$ denotes the emitter voltage of the transistor Q6 and $V_{BE}$ denotes the base emitter voltage of the transistor Q6.--

Signed and Sealed this

Fourteenth Day of January, 1997

Attest:

BRUCE LEHMAN

Attesting Officer          Commissioner of Patents and Trademarks